United States Patent
Abe et al.

(10) Patent No.: US 6,498,288 B1
(45) Date of Patent: Dec. 24, 2002

(54) SILICON GERMANIUM CRYSTAL

(75) Inventors: Takao Abe, Annaka (JP); Ichiro Yonenaga, Sendai (JP); Tetsuya Igarashi, Takefu (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/582,237

(22) PCT Filed: Nov. 5, 1999

(86) PCT No.: PCT/JP99/06168

§ 371 (c)(1),
(2), (4) Date: Jul. 24, 2000

(87) PCT Pub. No.: WO00/30975

PCT Pub. Date: Jun. 2, 2000

(30) Foreign Application Priority Data

Nov. 26, 1998 (JP) ............................................. 10-335894

(51) Int. Cl.$^7$ .............................................. H01L 35/00
(52) U.S. Cl. .................... 136/239; 136/236.1; 423/324; 423/344; 117/937
(58) Field of Search ................................. 423/324, 344; 428/689, 697, 700, 641; 117/930, 936, 949, 937; 136/236.1, 239

(56) References Cited

U.S. PATENT DOCUMENTS 4,711,971 A * 12/1987 Duncan et al. ............. 136/211
4,835,059 A * 5/1989 Kodata ....................... 428/432
6,118,151 A * 9/2000 Tsutsu ....................... 257/347

FOREIGN PATENT DOCUMENTS

JP 362047177 A * 2/1987
JP 363310111 A * 12/1988
JP 410189459 A * 7/1998

OTHER PUBLICATIONS

Abstract of Japanese Patent Publ. No. 06024893A; dated Feb. 1, 1994.
Abstract of Japanese Patent Publ. No. 04285096A; dated Oct. 9, 1992.
T. Sumitani et al., "Evaluation of Single Crystal; Ge (1–x) Six using X–ray Topography (in Japanese)," Jul. 1, 1992, Transaction of Japan Crystal Society, vol. 19, No. 1, p. 34 (Translation).
K. Ishigo et al., "Development of Single Crystal: Ge (1–x)—Si (x) (In Japanese)," Jul. 1, 1992, Transaction of Japan Crystal Society, vol. 19, No. 1, p. 72 (Translation).
Ed.: Y. Muto, "New Chemistry VIII—Semiconductor and Pure Metals (in Japanese)," Aug. 10, 1963, Kyoritsu Shuppan, p. 25.

* cited by examiner

*Primary Examiner*—Deborah Jones
*Assistant Examiner*—Stephen Stein
(74) *Attorney, Agent, or Firm*—Arent Fox Kintner Plotkin & Kahn, PLLC

(57) ABSTRACT

Provided is an SiGe crystal having an improved performance index and excellent machinability as a material constituting a thermoelectric element, neither degradation in characteristics nor cracking occurring during use. Crystal grains forming the crystal are $5 \times 10^{-5}$ mm$^3$ or more in size.

20 Claims, 8 Drawing Sheets

F I G. 7
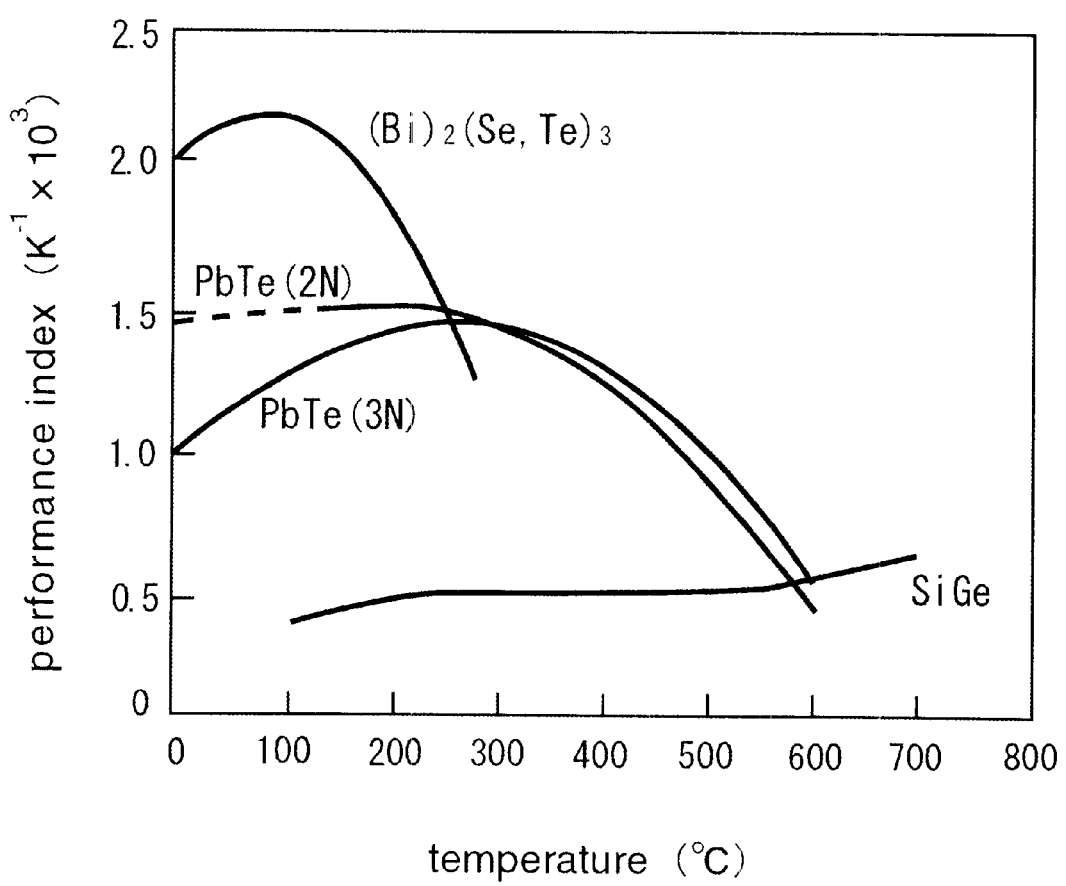

US 6,498,288 B1

SILICON GERMANIUM CRYSTAL

TECHNICAL FIELD

The present invention relates to a silicon germanium (SiGe) crystal preferably used as a thermoelectric element material and a thermoelectric element using the same.

BACKGROUND ART

When a P-type semiconductor material and a N-type semiconductor material are joined each other at two junctions and a temperature difference is given between the two junctions, there is generated thermoelectromotive force between them by the so-called Seebeck effect.

A thermoelectric element employing the above principle has no movable part and is simple in construction and hence with this element an energy direct conversion system which is high in reliability, long in lifetime and easy in maintenance may be quite within the bounds of possibility. Therefore, various kinds of thermoelectric element materials have conventionally produced and developed.

Among them, SiGe has been known as a typical thermoelectric element material of chemical stability and many proposals on improvements of its performance and production processes have been hitherto presented [for example, Japanese Patent Laid-open Publication No. 61-149453 (U.S. Pat. No. 4,711,971, European Patent No. 185499), Japanese Patent Laid-open Publication No. 8-56020, Japanese Patent No. 2623172].

The performance index Z which is an index of performance of the thermoelectric element is given by the following equation (1):

$$Z = \alpha^2 \sigma / K \qquad (1)$$

[In the equation (1), $\alpha$ is the Seebeck coefficient, $\sigma$ the electric conductivity, and K the thermal conductivity.]

The performance indexes Z of various thermoelectric element materials are shown in FIG. 7 in relation with the temperature. As is apparent from FIG. 7, in the case of an SiGe polycrystal obtained by a conventional production process, the performance index thereof is inferior to that of for example a tellurium based thermoelectric material such as $Bi_2Te_2$ or PbTe at a practical temperature ranging from 200° C. especially to 600° C., which is a weak point thereof in practical use.

Under these circumstances, in order to improve the performance index Z by raising the electric conductivity of the material with increase of concentrations of conduction electrons and holes thereof, there have been performed attempts wherein as dopants Group III elements such as B, Al and Ga are added into the P-type material, Group V elements such as P, As and Sb into the N-type material, and as disclosed in Japanese Patent Laid-open Publication Nos. 61-14953 and 8-56020, metals such as Pb, Sn, Fe, Ni and Cr, and silicides thereof into the material.

With these improvements, the performance index Z of SiGe has been improved, but there is a great demand for further improvements of the performance index for practical use.

There has been another problem, since an ingot of SiGe is produced by means of the casting method or the Bridgemann process in which components Si, Ge and additives such as dopants are mixed to form a mixture in respective predetermined amounts, and then molten to become a composition as homogeneous as possible, followed by cooling, or by means of powder sintering the mixture, the obtained ingot is collective concretion of crystal grains.

For the above reason, there have arisen the following obstacles 1~3 that hinders real practical use of SiGe as the thermoelectric material: 1 As scattering of carriers at grain boundaries of the ingot cannot be avoided, the improvement of the electric conductivity thereof is impeded. 2 As grain boundary segregation arises at a practical temperature of 200° C. or higher, especially in the vicinity of a high temperature heat source of 500° C. or higher, the characteristics thereof degrade in process of time. 3 Local inhomogeneity of the composition in the ingot is inevitable, thereby characteristics being further degraded and cracking easily occurring not only in mechanical processing but during use.

Through a diligent research conducted with a view to the drawbacks of the polycrystalline SiGe obtained by the conventional production process, the present inventors have acquired an inventive idea that the drawbacks are solved and an SiGe thermoelectric element practically usable can be realized by increasing sizes of crystal grains forming an SiGe block, preferably of a single crystal. As a result of various actual investigations of the idea, the present inventors have succeeded in producing an SiGe crystal ingot composed of crystal grains of $5 \times 10^{-5}$ mm$^3$ or more in size almost over all the range of x of $Si_xGe_{1-x}$ (0<x<1) by means of the Czochralski method.

It is an object of the present invention to provide an SiGe crystal material that realizes the improvement of the performance index as the thermoelectric element and is excellent in machinability, there arising neither degradation in the characteristics nor cracking during use.

DISCLOSURE OF THE INVENTION

To solve the above problem, an $Si_xGe_{1-x}$ (0<x<1) crystal of the present invention is characterized in that crystal grains forming said crystal are $5 \times 10^{-5}$ mm$^3$ or more in size.

The $Si_xGe_{1-x}$ (0<x<1) crystal is preferably produced by means of a pulling method.

The $Si_xGe_{1-x}$ (0<x<1) crystal has preferably an absolute value of the Seebeck coefficient in the range of 100 to 700 $\mu$V/K.

The $Si_xGe_{1-x}$ (0<x<1) crystal has preferably a value of a thermal conductivity in the range of 1 to 20 W/m·K.

The $Si_xGe_{1-x}$ (0<x<1) crystal has preferably a value of the electric conductivity in the range of $10^1$ to $10^5$ W/Ω·m.

The $Si_xGe_{1-x}$ (0<x<1) crystal has more preferably an absolute value of the Seebeck coefficient in the range of 100 to 700 $\mu$V/K, a value of the thermal conductivity in the range of 1 to 20 W/m·K and a value of the electric conductivity in the range of $10^1$ to $10^5$ W/Ω·m.

The $Si_xGe_{1-x}$ (0<x<1) crystal has preferably a value of x in the range of 0.6 to 0.8.

A P-type thermoelectric material may be produced by adding an element selected from B, Al or Ga into the $Si_xGe_{1-x}$ (0<x<1) crystal.

An N-type thermoelectric material may be produced by adding an element selected from P, As or Sb into the $Si_xGe_{1-x}$ (0<x<1) crystal.

The $Si_xGe_{1-x}$ (0<x<1) crystal is preferably a single crystal.

A thermoelectric element of the present invention is characterized by using the $Si_xGe_{1-x}$ (0<x<1) crystal described above.

When sizes of crystal grains forming an $Si_xGe_{1-x}$ (0<x<1) crystal are increased, the mechanical strength of the crystal is improved and sustained highly especially at a high temperature at which a thermoelectric element is used, so that the crystal is mechanically stable under working environment of the element, and hence degradation of the element may be suppressed. These functions are more conveniently enhanced in the case where the crystal ingot is a single crystal.

BRIEF DESCRIPTION OF THE DRAWINGS

FIG. 7 is a graph showing the relation between the performance index of each of various thermoelectric elements and the temperature.

BEST MODE FOR CARRYING OUT THE INVENTION

The present invention will be described below by way of the following examples which should be construed as illustrative rather than restrictive.

EXAMPLE 1

Using a crystal pulling apparatus, Si and Ge together with dopants were molten in a quartz crucible and a SiGe crystal was pulled from the in the argon gas flow at 1 atm. at a pulling speed ranging from 1 to 10 mm/hr with an Si single crystal as a seed crystal. As for the SiGe crystal, seven crystals shown in Table 1 were pulled with the value of x of $Si_xGe_{1-x}$ varying between 0.01 and 0.99. Sizes of crystal grains forming each crystal were $5 \times 10^{-5}$ mm³ or more (about 50 µm or more in average diameter). In the No. 5 sample, Ga was doped for the purpose of obtaining a P-type crystal.

TABLE 1

| Pulled SiGe crystals | | |
|---|---|---|
| Sample No. | Silicon Content (x) | Dopant Concentration |
| 1 | 0.01 | — |
| 2 | 0.23 | — |
| 3 | 0.44 | — |
| 4 | 0.64 | — |
| 5 | 0.80 | Ga: $2 \times 10^{17}$/cm³ |
| 6 | 0.82 | — |
| 7 | 0.99 | — |

Measurement of Thermal Conductivity

The pulled crystals were sliced into disk-shape samples 10 mm in diameter and 1 mm in thickness and using the samples the thermal conductivity was measured by means of a laser flash method. The laser flash method is to evaluate the thermal conductivity on the basis of the temperature change on a back surface of the sample when applying instantly a laser beam to a front surface thereof.

Figure 1:
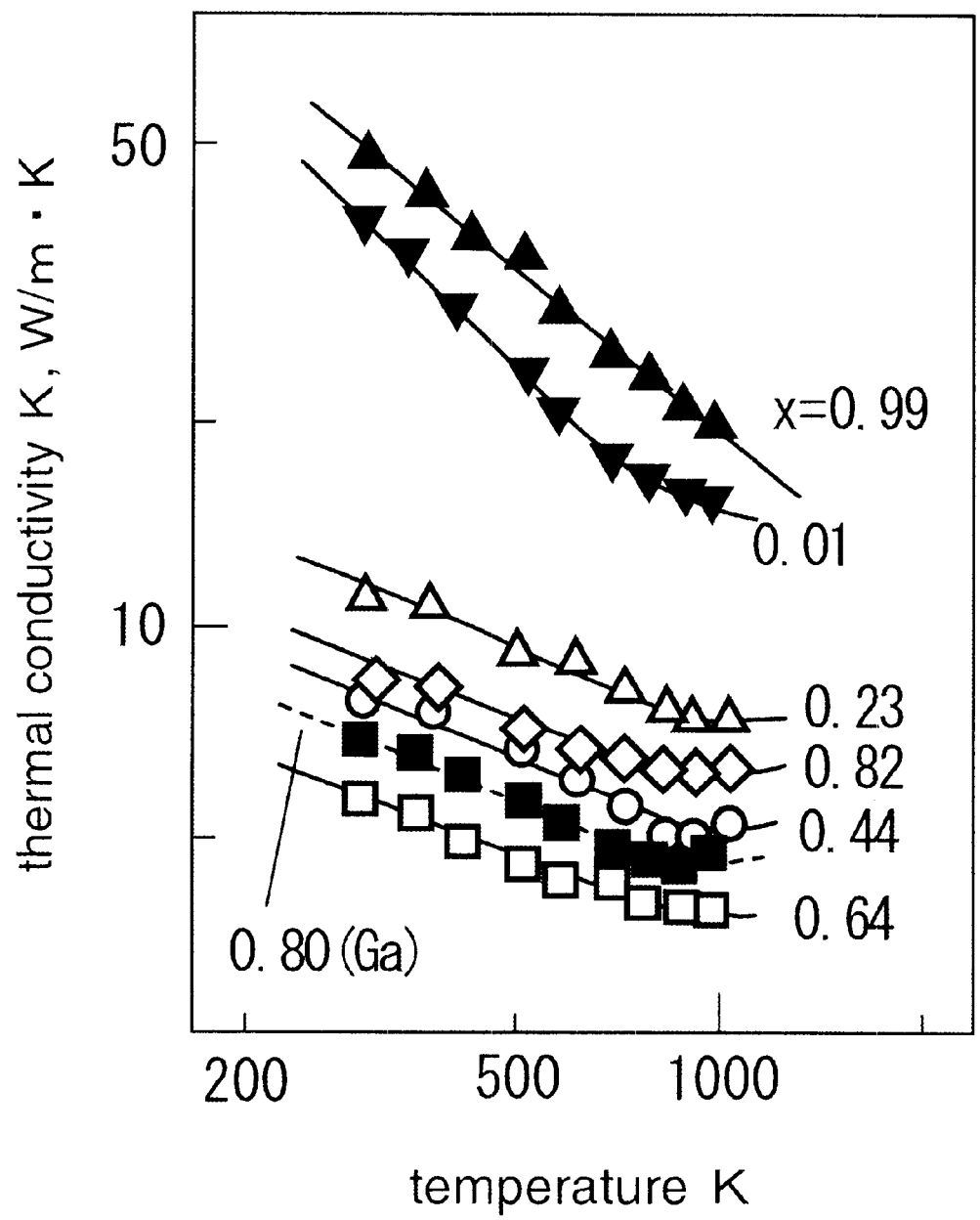
FIG. 1 is a graph showing the relation between the thermal conductivity of each of the $Si_xGe_{1-x}$ crystals of different compositions and the temperature.

FIG. 1 shows the relation between the thermal conductivity of each of the $Si_xGe_{1-x}$ crystal samples Nos. 1 to 7 of different compositions and the temperature. It is seen from the graph that thermal conductivity of each of the mixed crystals is smaller in comparison with Si and Ge at any temperature.

Figure 2:
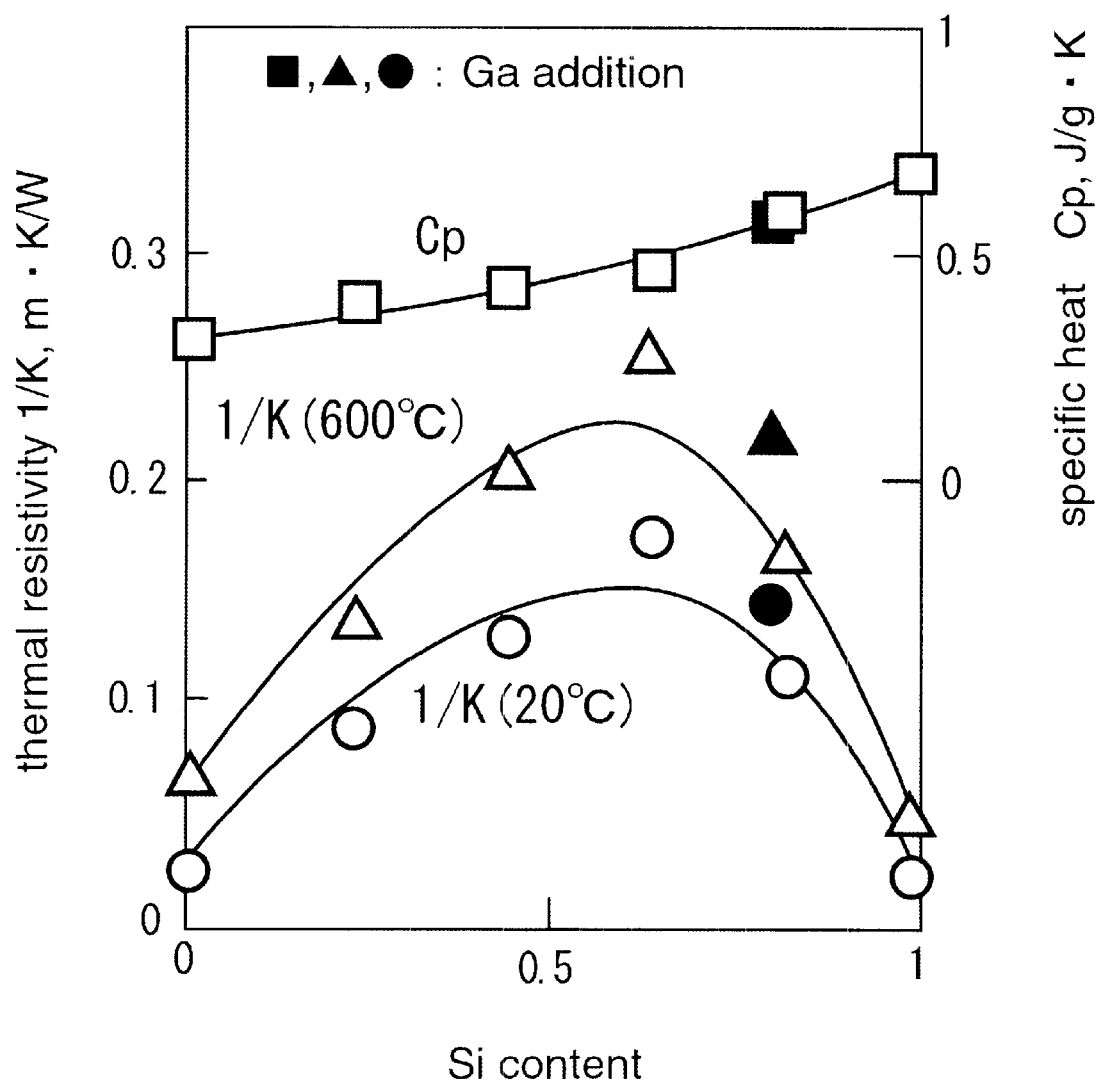
FIG. 2 is a graph showing the way how the thermal resistivity of the $Si_xGe_{1-x}$ crystal changes according to the value of x at the lower side temperature (20° C.) and the higher side temperature (600° C.) of respective two junctions.

FIG. 2 shows the way how the thermal resistivity (a reciprocal of the thermal conductivity) of the $Si_xGe_{1-x}$ crystal changes according to the value of x at 20° C. and 600° C., as typical examples of the lower and higher side temperatures, of respective two junctions, which comes to the maximum when x is around 0.6. This is supposed to be caused by phonon scattering. The addition of Ga raises the thermal resistivity slightly (the black circle and triangle in FIG. 2). The higher Ga concentration is, the more the thermal resistivity is expectantly. The specific heat increases with increase in the Si component.

Measurement of Electric Conductivity

Samples of $3 \times 1 \times 10$ mm³ were prepared from pulled crystals to measure the electric conductivity by means of the four-point probe method in which four probes are placed in a line on the sample and current is passed through the outer two probes and the potential developed across the inner two probes is measured.

Figure 3:
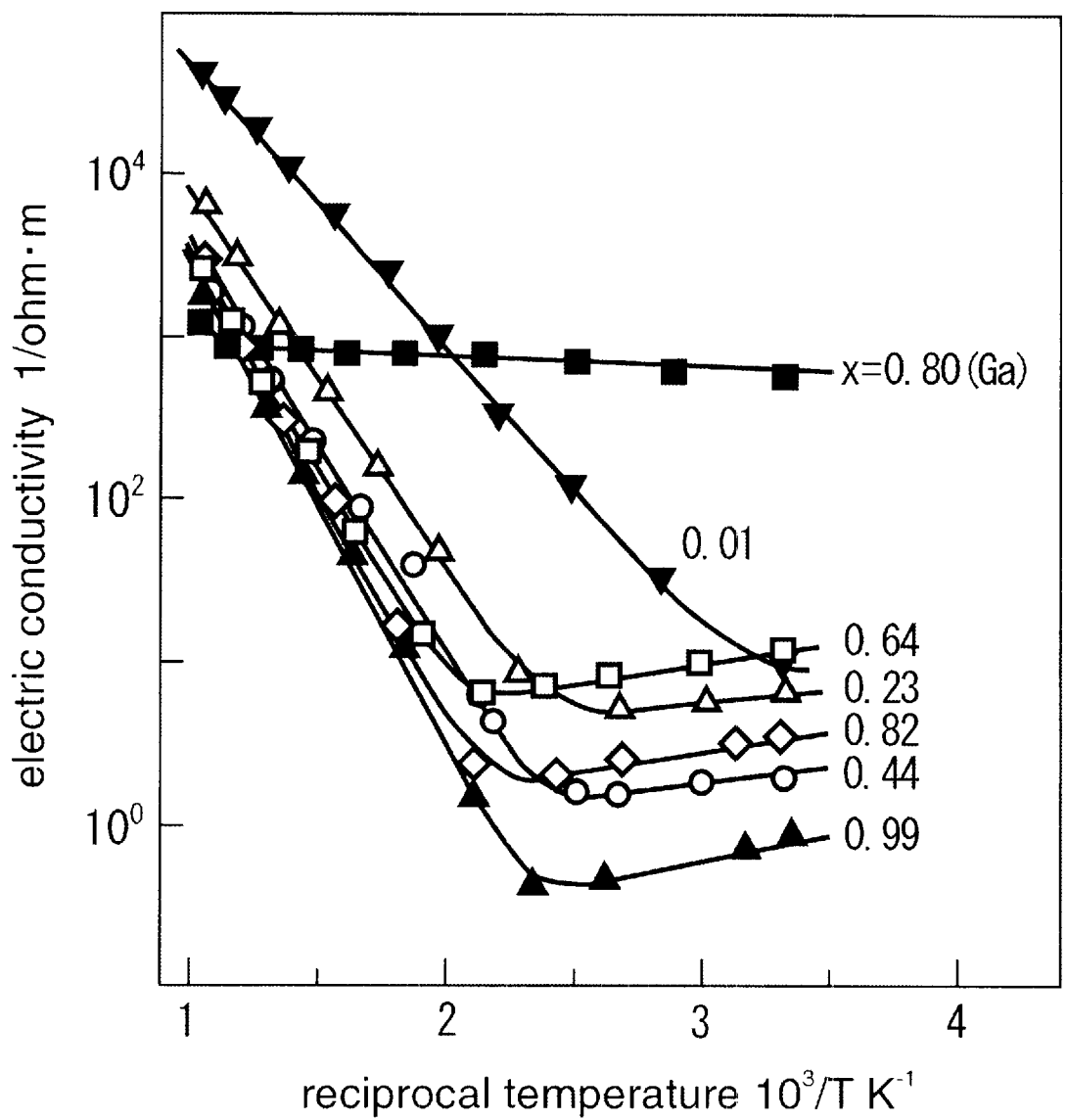
FIG. 3 is a graph showing the change in the electric conductivity of the $Si_xGe_{1-x}$ crystal against the temperature.

The change in the electric conductivity against the temperature is shown in FIG. 3. In most of samples, the electric conductivity exponentially increases with the temperature at 100 to 200° C. and higher. The sample added with Ga shows an almost constant value of the electric conductivity up to a high temperature. It is expected that Ga addition with a higher concentration leads a higher and constant value of the electric conductivity up to a high temperature.

Figure 4:
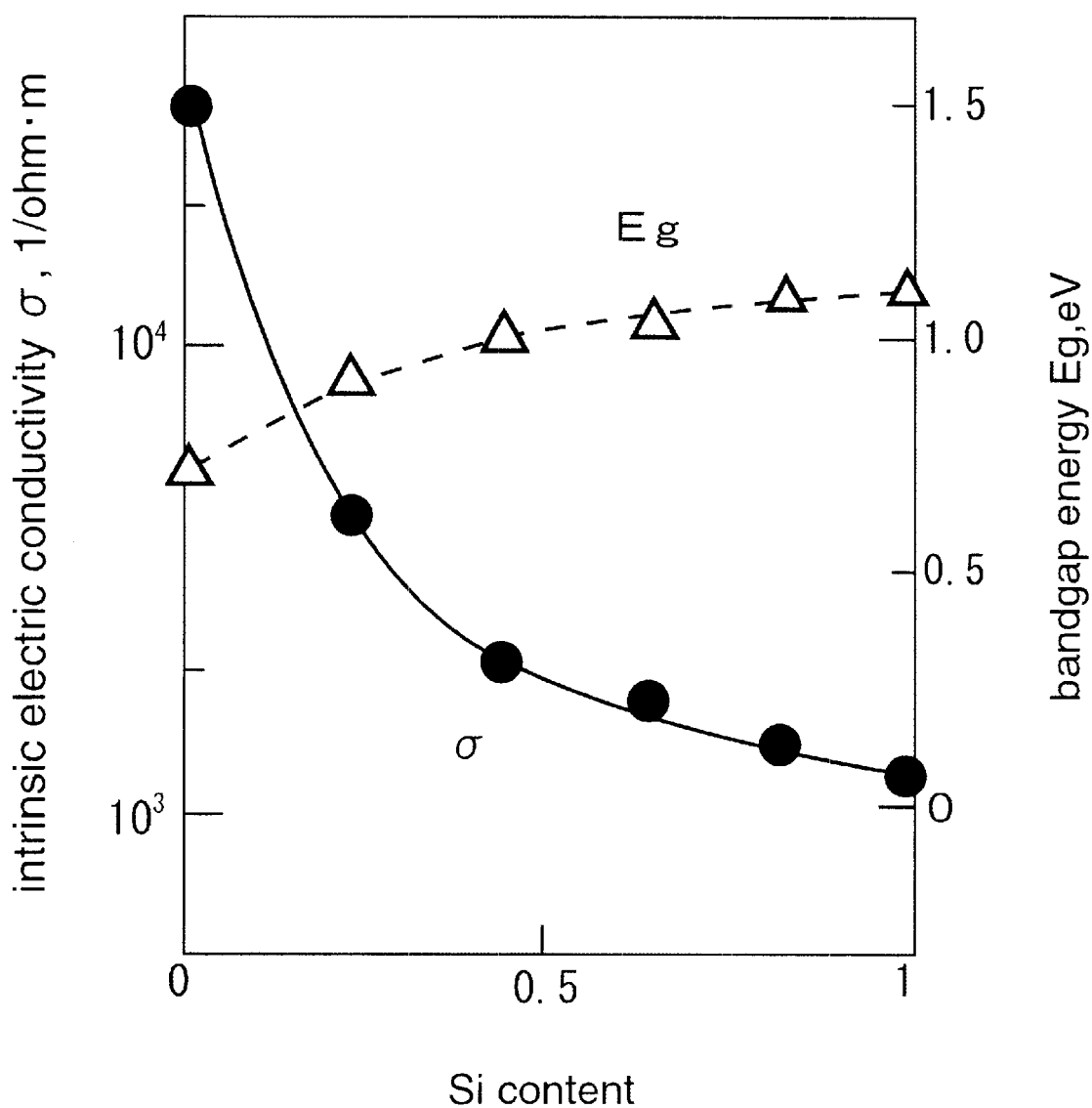
FIG. 4 is a graph showing the change in the intrinsic electric conductivity and the bandgap energy of the $Si_xGe_{1-x}$ crystal at 600° C. according to the composition thereof.

The change in the intrinsic electric conductivity at 600° C. according to the composition is shown in FIG. 4. It is seen that the richer Ge is, the higher the electric conductivity becomes. However, if impurities are added at a high concentration, a high value of the electric conductivity can be obtained even in an Si rich crystal. Further, the dependence of the bandgap against the composition is also shown.

Measurement of Seebeck Coefficient

The pulled crystals were sliced into disk-shape samples 10 mm in diameter and 1 mm in thickness and using the samples the Seebeck coefficient was measured by means of a temperature difference method. The temperature difference method is to measure a thermoelectromotive force generated between both contact faces of a sample held between thermal blocks of different temperatures.

Figure 5:
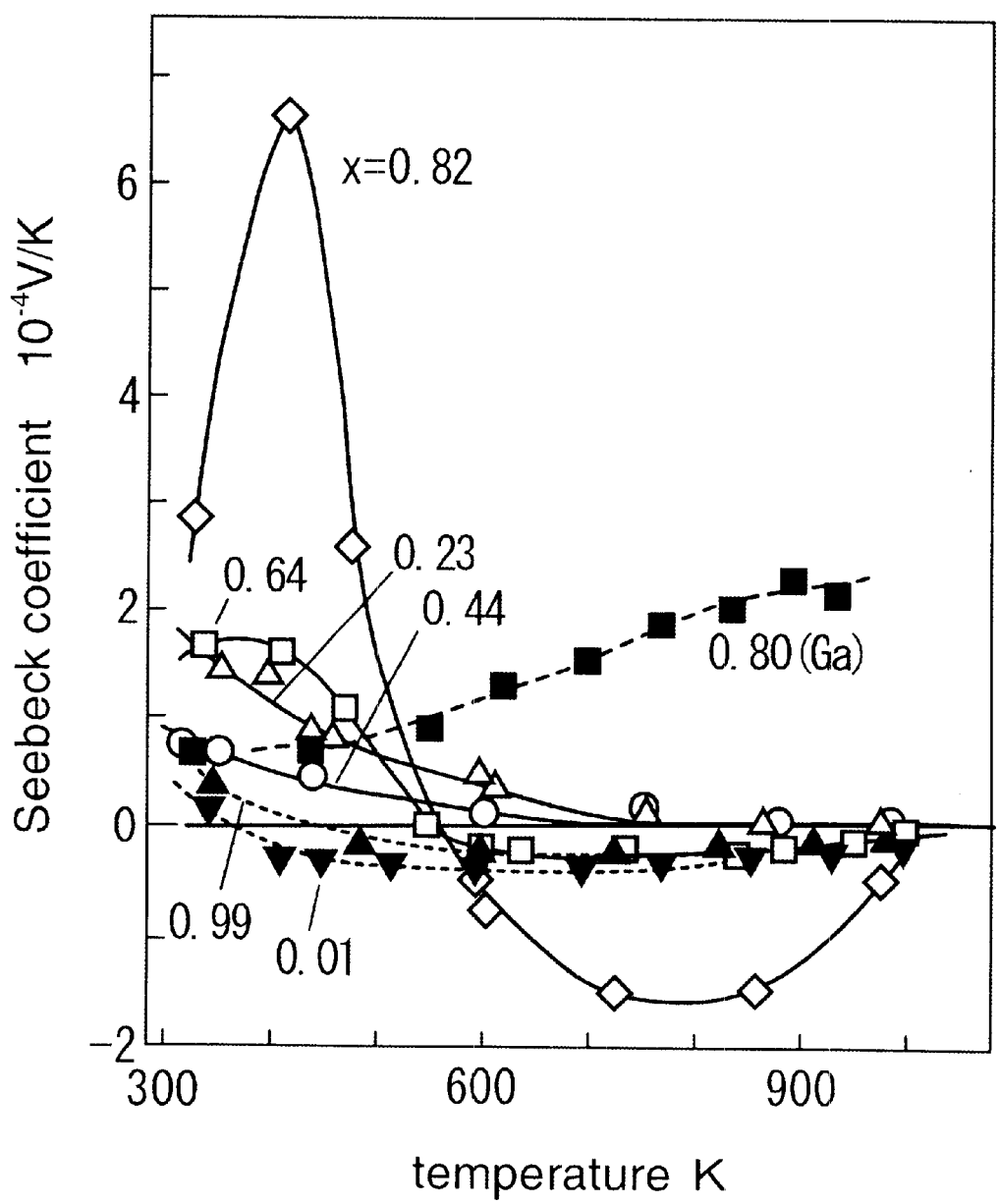
FIG. 5 is a graph showing the change in the Seebeck coefficient of the $Si_xGe_{1-x}$ crystal against the temperature.

FIG. 5 shows the change in the Seebeck coefficient against the temperature. In the non-doped crystals, the Seebeck coefficient remarkably changes from a positive value (a P-type semiconductor) to a negative value (a N-type semiconductor or an intrinsic semiconductor region) with samples of 0.6 to 0.8 in the composition, the values being high, respectively. In the Ga added sample, the Seebeck coefficient increases monotonously with the temperature.

Figure 6:
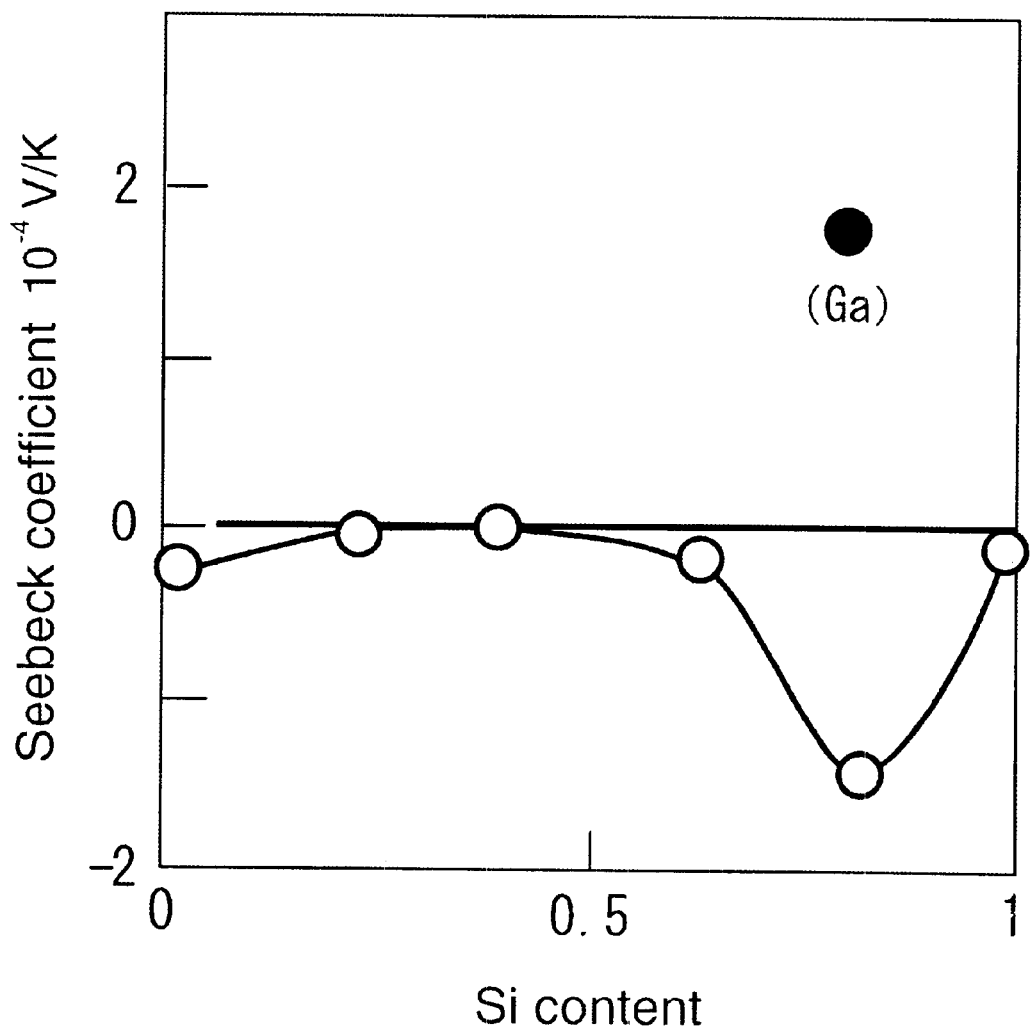
FIG. 6 is a graph showing the dependence of the Seebeck coefficient of the $Si_xGe_{1-x}$ crystal against the composition at 600° C.

FIG. 6 shows the dependence of the Seebeck coefficient against the composition at 600° C. In the composition of around 0.8, a large absolute value thereof is expected. The more the impurity concentration of Ga is, the lower the Seebeck coefficient becomes, so that the optimal Ga concentration is necessarily investigated in practical use. In the composition of around 0.1 to 0.5, the difference in the mobility between electrons and holes is small in the composition of around 0.1 to 0.5 and hence a high value of the Seebeck coefficient cannot be expected.

Performance Index Z

In order to attain a high performance index, it is desired that the thermal conductivity is low but the electric conductivity and the Seebeck coefficient are both high, but these values have been known first by the measurement of the inventors, and in view of working conditions (a temperature range) composition of $Si_xGe_{1-x}$ (a value of x) and a dopant concentration may be determined in such a manner as the value of the performance index becomes as high as possible.

The electric conductivity changes according to amounts of added dopants and increases almost in proportion to a concentration thereof. On the other hand, the Seebeck coefficient decreases with a dopant concentration and it has been known that the range of $10^{18}$ to $10^{20}(/cm^3)$ with around $10^{19}/cm^3$ as the center is theoretically preferred to attain a high performance index, so an SiGe crystal of a dopant concentration at this level is a preferred material from a practical viewpoint.

EXAMPLE 2

Figure 8:
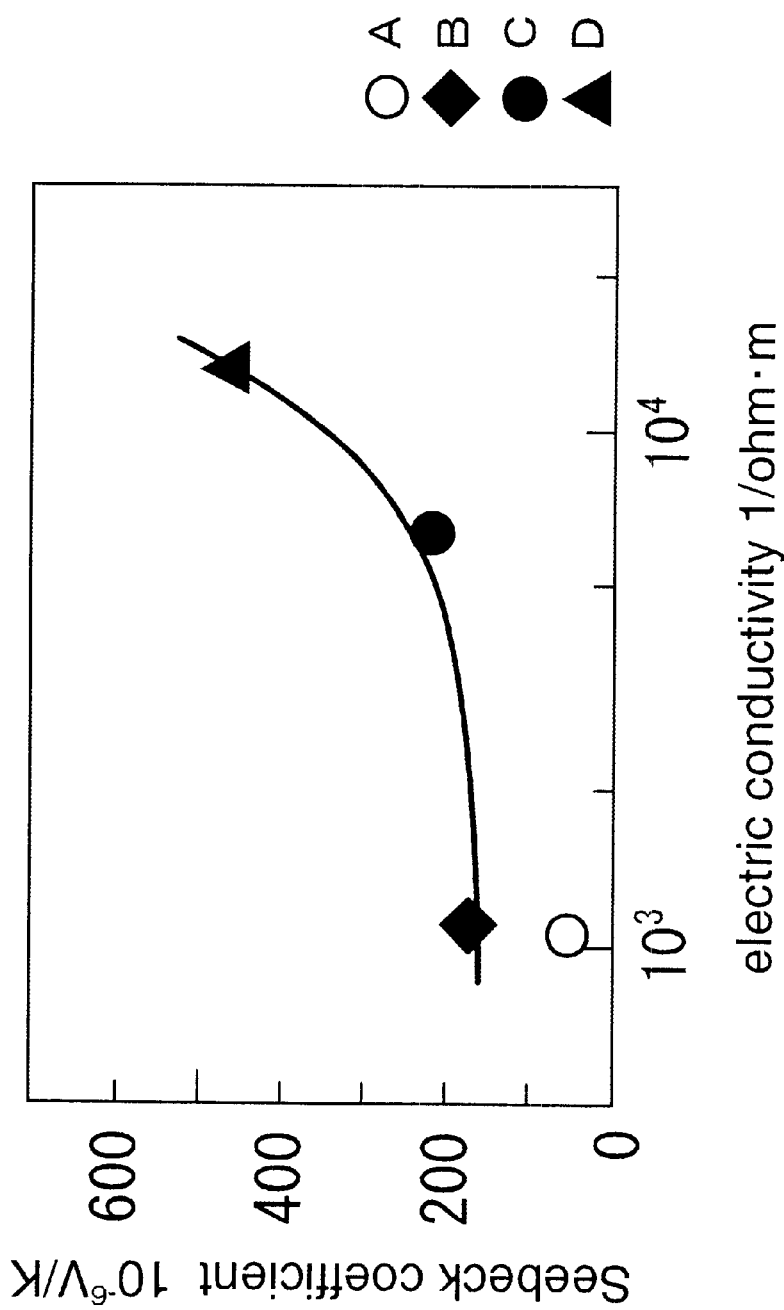
FIG. 8 is a graph showing the relation between the Seebeck coefficient and the electric conductivity of the $Si_xGe_{1-x}$ crystal at 600° C.

Changing a concentration of the Ga dopant, four kinds of SiGe crystals shown in Table 2 were pulled and the electric conductivity and the Seebeck coefficient both at 600° C. were measured by means of the same measuring methods as Example 1. The results are shown in FIG. 8.

Average grain diameters of the samples B and D were about 50 μm and about 200 μm, respectively and assuming that these grain shapes are spherical, the volumes thereof are about $6.5 \times 10^{-5}$ mm$^3$ and about $4.2 \times 10^{-3}$ mm$^3$, respectively.

TABLE 2

| Samples | Crystalline state | Si content (x) | Dopant (Ga) concentration |
| --- | --- | --- | --- |
| A | single crystal | 0.91 | $5.6 \times 10^{13}/cm^3$ (non-doped) |
| B | polycrystal (about 50 μm in diamter) | 0.80 | $2.0 \times 10^{17}/cm^3$ |
| C | single crystal | 0.95 | $1.3 \times 10^{19}/cm^3$ |
| D | polycrystal (about 200 μm in diameter) | 0.81 | $7.0 \times 10^{19}/cm^3$ |

Capability of Exploitation in Industry

As described above, according to the $Si_xGe_{1-x}$ (0<x<1) crystal of the present invention, there are realized great advantages that the performance index as the thermoelectric element can be improved, the crystal is excellent in machinability, and neither degradation in characteristics nor cracking occurs during use.

What is claimed is:

1. An $Si_xGe_{1-x}$ (0<x<1) crystal ingot characterized in that crystal grains forming said crystal ingot are $5 \times 10^{-5}$ mm$^3$ or more in size.

2. The $Si_xGe_{1-x}$ (0<x<1) crystal ingot according to claim 1, characterized in that said crystal ingot is produced by means of a pulling method.

3. The $Si_xGe_{1-x}$ (0<x<1) crystal ingot according to claim 1, characterized in that said crystal ingot has an absolute value of the Seebeck coefficient in the range of 100 to 700 μV/K.

4. The $Si_xGe_{1-x}$ (0<x<1) crystal ingot according to claim 2, characterized in that said crystal ingot has an absolute value of the Seebeck coefficient in the range of 100 to 700 μV/K.

5. The $Si_xGe_{1-x}$ (0<x<1) crystal ingot according to claim 1, characterized in that said crystal ingot has a value of the thermal conductivity in the range of 1 to 20 W/m·K.

6. The $Si_xGe_{1-x}$ (0<x<1) crystal ingot according to claim 2, characterized in that said crystal ingot has a value of the thermal conductivity in the range of 1 to 20 W/m·K.

7. The $Si_xGe_{1-x}$ (0<x<1) crystal ingot according to claim 1, characterized in that said crystal ingot has a value of the electric conductivity in the range of $10^1$ to $10^5$ W/Ω·m.

8. The $Si_xGe_{1-x}$ (0<x<1) crystal ingot according to claim 2, characterized in that said crystal ingot has a value of the electric conductivity in the range of $10^1$ to $10^5$ W/Ω·m.

9. The $Si_xGe_{1-x}$ (0<x<1) crystal ingot according to claim 1, characterized in that said crystal ingot has an absolute value of the Seebeck coefficient in the range of 100 to 700 μV/K, a value of the thermal conductivity in the range of 1 to 20 W/m·K and a value of the electric conductivity in the range of $10^1$ to $10^5$ W/Ω·m.

10. The $Si_xGe_{1-x}$ (0<x<1) crystal ingot according to claim 2, characterized in that said crystal ingot has an absolute value of the Seebeck coefficient in the range of 100 to 700 μV/K, a value of the thermal conductivity in the range of 1 to 20 W/m·K and a value of the electric conductivity in the range of $10^1$ to $10^5$ W/Ω·m.

11. The $Si_xGe_{1-x}$ (0<x<1) crystal ingot according to claim 1, characterized in that said crystal ingot has a value of x in the range of 0.6 to 0.8.

12. The $Si_xGe_{1-x}$ (0<x<1) crystal ingot according to claim 2, characterized in that said crystal ingot has a value of x in the range of 0.6 to 0.8.

13. The $Si_xGe_{1-x}$ (0<x<1) crystal ingot according to claim 1, characterized in that an element selected from B, Al or Ga is added to said crystal ingot.

14. The $Si_xGe_{1-x}$ (0<x<1) crystal ingot according to claim 2, characterized in that an element selected from B, Al or Ga is added to said crystal ingot.

15. The $Si_xGe_{1-x}$ (0<x<1) crystal ingot according to claim 1, characterized in that an element selected from P, As or Sb is added to said crystal ingot.

16. The $Si_xGe_{1-x}$ (0<x<1) crystal ingot according to claim 2, characterized in that an element selected from P, As or Sb is added to said crystal ingot.

17. The $Si_xGe_{1-x}$ (0<x<1) crystal ingot according to claim 1, characterized in that said crystal ingot is a single crystal ingot.

18. The $Si_xGe_{1-x}$ (0<x<1) crystal ingot according to claim 2, characterized in that said crystal is a single crystal ingot.

19. A thermoelectric element characterized by using said $Si_xGe_{1-x}$ (0<x<1) crystal ingot according to claim 1.

20. A thermoelectric element characterized by using said $Si_xGe_{1-x}$ (0<x<1) crystal ingot according to claim 2.

* * * * *